(12) United States Patent
Aslami et al.

(10) Patent No.: US 7,816,269 B2
(45) Date of Patent: Oct. 19, 2010

(54) PLASMA DEPOSITION APPARATUS AND METHOD FOR MAKING POLYCRYSTALLINE SILICON

(75) Inventors: Mohd A. Aslami, Sturbridge, MA (US); Dau Wu, Fallbrook, CA (US); DeLuca Charles, South Windsor, CT (US)

(73) Assignee: Silica Tech, LLC, White Plains, NY (US)

( * ) Notice: Subject to any disclaimer, the term of this patent is extended or adjusted under 35 U.S.C. 154(b) by 474 days.

(21) Appl. No.: 11/714,223

(22) Filed: Mar. 6, 2007

(65) Prior Publication Data

US 2008/0009126 A1    Jan. 10, 2008

Related U.S. Application Data

(60) Provisional application No. 60/818,966, filed on Jul. 7, 2006.

(51) Int. Cl.
*H01L 21/302* (2006.01)
*H01L 21/461* (2006.01)

(52) U.S. Cl. .................................. 438/689; 422/186

(58) Field of Classification Search ............... 422/186; 438/689

See application file for complete search history.

(56) References Cited

U.S. PATENT DOCUMENTS 6,253,580 B1    7/2001    Gouskov et al.

| | | | |
|---|---|---|---|
| 6,686,558 B2 * | 2/2004 | Selitser | 219/121.52 |
| 7,473,443 B2 * | 1/2009 | Matsuki et al. | 427/452 |
| 2003/0133853 A1 | 7/2003 | Kelsey | |
| 2004/0115936 A1 * | 6/2004 | DePetrillo et al. | 438/689 |
| 2005/0145163 A1 * | 7/2005 | Matsuki et al. | 117/68 |
| 2009/0071404 A1 * | 3/2009 | Tada et al. | 118/723 ME |
| 2009/0134120 A1 * | 5/2009 | Ohmi et al. | 216/69 |

FOREIGN PATENT DOCUMENTS

| EP | 0 286 306 | 10/1988 |
|---|---|---|
| EP | 1 281 680 | 2/2003 |

OTHER PUBLICATIONS

"Ultrafast deposition of microcrystalline Si by thermal plasma chemical vapor deposition", Journal of Applied Physics, vol. 89, No. 12, Jun. 15, 2001.

* cited by examiner

*Primary Examiner*—Fernando L Toledo
(74) *Attorney, Agent, or Firm*—Patton Boggs LLP

(57) ABSTRACT

A plasma deposition apparatus for making polycrystalline silicon including a chamber for depositing said polycrystalline silicon, the chamber having an exhaust system for recovering un-deposited gases; a support located within the deposition chamber for holding a target substrate having a deposition surface, the deposition surface defining a deposition zone; at least one induction coupled plasma torch located within the deposition chamber and spaced apart from the support, the at least one induction coupled plasma torch producing a plasma flame that is substantially perpendicular to the deposition surface, the plasma flame defining a reaction zone for reacting at least one precursor gas source to produce the polycrystalline silicon for depositing a layer of the polycrystalline silicon the deposition surface.

30 Claims, 5 Drawing Sheets

PLASMA DEPOSITION APPARATUS AND METHOD FOR MAKING POLYCRYSTALLINE SILICON

CROSS-REFERENCES TO RELATED APPLICATIONS

This application claims the benefit of U.S. Provisional Application No. 60/818,966, filed Jul. 7, 2006.

FIELD OF THE INVENTION

The present invention relates to an apparatus and process for making polycrystalline silicon.

Problem

As oil prices have continued to increase and other energy sources remain limited, there is increasing pressure on global warming from the emissions of burning fossil fuel. There is a need to find and use alternative energy sources, such as solar energy because it is free and does not generate carbon dioxide gas. To that end, many nations are increasing their investment in safe and reliable long-term sources of power, particularly "green" or "clean" energy sources. Nonetheless, while the solar cell, also known as a photovoltaic cell or modules, has been developed for many years, it had very limited usage because the cost of manufacturing these cells or modules is still high, making it difficult to compete with energy generated by fossil fuel.

Presently, the single crystal silicon solar cell has the best energy conversion efficiency, but it also has high manufacturing cost associated with it. Alternatively, polycrystalline silicon while it does not have the same high efficiency of a single crystal cell, it is much cheaper to produce. Therefore, it has the potential for low cost photovoltaic power generation. One known method for making a single crystal ingot is to use a floating zone method to reprocess a polycrystalline silicon rod. Another known method is the Czochralski method that uses a seed crystal to pull a melted silicon from a melting crucible filled with polycrystalline silicon nuggets.

In addition, some prior art processes of making polysilicon use chlorosilanes that are dissociated by resistance-heated filaments to produce silicon, which is then deposited inside a bell-jar reactor. It is commonly known to make a semiconductor grade silicon with trichlorosilane and then later recycle these chlorosilanes. Also, there have been many attempts using different raw materials to make polysilicon followed by re-processing these un-reacted chemicals. Nevertheless, these previous attempts do not have a high deposition rates.

Another attempt is to use a high pressure plasma with chlorosilane to make polycrystalline silicon, and then recycle the un-reacted chemicals. In this attempt, the deposition takes place on the inside wall of a substrate to form a sheet type silicon that will eventually be separated from the substrate, thus requiring additional process steps.

In addition, a commonly known process involves making a solar cell by (i) manufacturing polycrystalline silicon, (ii) making either a single crystal or a polycrystalline ingot or block, (iii) making wafers from the ingot or block (iv) and then making a cell, that includes the step of p-type and n-type doping via a costly diffusion process. The p-type and n-type dopants form the p-n junction of the semiconductor material. This step is normally done in extremely slow diffusion furnaces after the thin-film layer has already been deposited, thus further slowing down the overall process of efficiently producing solar cells.

In addition, prior art methods have the deposition surface parallel to the plasma flame stream, thus the collection efficiency is much lower. The gaseous silicon hydrides are deposited using a high-frequency plasma chemical vapor deposition process to deposit silicon on a horizontal silicon core rod. Because of the orientation of the deposition apparatus, much of the silicon products are exhausted out of the apparatus.

Further known prior art methods for producing silicon create internal strain within the silicon rod. An attempt to reduce the internal stress follows the basic Siemens process and making the silicon rod in a bell-jar, where the process steps are: heating a silicon core material in a gaseous atmosphere including trichlorosilane and hydrogen to deposit silicon on the silicon core material to produce a polycrystalline silicon rod, heating the polycrystal silicon rod by applying an electric current without allowing the polycrystal silicon rod to contact with air so that the surface temperature of the polycrystal silicon rod is higher than the deposition reaction temperature of silicon and is 1,030° C. or higher, and shutting off the electric current after the heating by reducing the applied current as sharply as possible, thereby attempting to reduce the internal strain rate of the polycrystal silicon rod. As can be seen, this process involves a plurality of additional steps.

In another attempt to produce a polycrystalline silicon metal from a silicon halide plasma source, the silicon halide is split into silicon and halide ions in an inductively coupled plasma and silicon ions are then condensed to form molten silicon metal that can be vacuum cast into polysilicon ingots. In addition, the laden gases are fluorine and chlorine. Fluorine and hydrogen fluoride are highly corrosive, thus they require special corrosion resistant material for building the equipment and when handling these chemicals special case must be taken.

Information relevant to attempts to address these problems can be found in the U.S. Pat. No. 4,292,342 issued 29 Sep. 1981 to Sarma et al.; U.S. Pat. No. 4,309,259 issued 5 Jan. 1982 to Sarma et al.; U.S. Pat. No. 4,321,246 issued 23 Mar. 1982 to Sarma et al.; U.S. Pat. No. 4,491,604 issued 1 Jan. 1985 to Lesk et al.; U.S. Pat. No. 4,590,024 issued 20 May 1986 to Lesk et al., U.S. Pat. No. 5,976,481 issued 2 Nov. 1999 to Kubota et al.; U.S. Pat. No. 6,503,563 issued 7 Jan. 2003 to Yatsurugi et al; and U.S. Pat. No. 6,926,876 issued 9 Aug. 2005 to Kelsey.

Solution

The above-described problems are solved and a technical advance achieved by the present plasma deposition apparatus and method for making polycrystalline silicon disclosed in this application. The present plasma deposition apparatus includes a deposition chamber that contains preferably a set or plurality of induction coupled plasma torches. The induction coupled plasma torches are oriented substantially perpendicular from a deposition surface of a target substrate to produce a large deposition area on the target substrate. By being substantially perpendicular to the deposition surface, the polycrystalline silicon that is created in the reaction zone near the end of the induction coupled plasma torches flows directly towards the perpendicular substantially planar deposition surface. In addition, the present plasma deposition apparatus rotates the target substrate during deposition to produce a uniform layer of polycrystalline silicon on the deposition surface. Also, a support moves the target substrate away from the induction coupled plasma torches during deposition to provide a constant or fixed distance between the induction coupled plasma torches and the deposition surface.

The present method for making polycrystalline silicon eliminates the manufacturing of polysilicon as a separate process and also eliminates the additional p-type and n-type doping processing steps that occur subsequently. In addition, the present method for making polycrystalline silicon can also use and reuse the same raw materials, because the un-reacted or un-deposited chemicals can be collected and recycled for reprocessing through the present apparatus.

The present method for making polycrystalline silicon does not use different types of material as a substrate, thus there is no additional process for separation. The present method for making polycrystalline silicon eliminates the additional processing steps found in conventional deposition methods, which can cause extra process loss. Further, the present method for making polycrystalline silicon also minimizes the potential contamination of the substrate.

The present method for making polycrystalline silicon has no limitation on the size of the target area and the produced silicon ingot can be removed to provide a continuous process. The present method for making polycrystalline silicon also separates the reaction zone from the deposition zone. By doing so, the process temperature of the reaction zone can be thermodynamically optimized for higher chemical reaction efficiency. Moreover, in the deposition zone, optimal temperatures for better deposition efficiency and product quality can be achieved. Since the deposition surface of the silicon ingot is facing substantially perpendicular to the plasma flame of the induction coupled plasma torch, a larger collecting or deposition surface is available for silicon deposition. The vertical deposition method as herein disclosed has a higher deposition rate than that achieved in a deposition of a curved surface, such as on a rod form.

The novel process uses at least one induction coupled plasma torch aligned substantially perpendicular to the deposition surface target to deposit silicon on the vertical axis of the target. Using more than one induction coupled plasma torch will further increase the deposition rate and will increase the deposition area of the target, which can further reduce manufacturing costs of a solar cell. It has a higher deposition rate, and it can be designed as a continuous flow process such that it can dramatically lower the manufacturing cost of a polycrystalline silicon. Its novel design provides for a better separation of the reaction and collection processes. Through its design, the present apparatus accomplishes increased reaction temperatures, thus higher reaction conversions while concurrently providing more optimal product collection temperatures.

The novel apparatus and method for making polycrystalline silicon produces doped or undoped silicon ingots in one step and at a very high deposition rate, thus producing finished and semi-finished silicon ingots from polysilicon raw materials economically with much less capital investment than the standard polysilicon manufacturing processes. In addition, a dopant, such as boron or phosphorous and the like, can be deposited simultaneously to generate a p-type or n-type ingot, thus eliminating a costly diffusion process down stream of the cell manufacturing process. The plasma deposition apparatus and method for making polycrystalline silicon further provides better deposition control and more uniform dopant distribution while eliminating the diffusion step of conventional processes, thus yielding a higher production rate of doped silicon.

Also, the plasma deposition apparatus and method for making polycrystalline silicon can collect, separate, and recycle most of the process gases and the un-deposited chemicals. These un-deposited chemicals can then be further processed into either single-crystal silicon or polycrystalline silicon.

The present methods for making polycrystalline silicon does not use a bell-jar, and most likely will not experience the same stress problems associated with that prior art process. This is because the silicon is deposited on the end of the target substrate, and thus it will have less temperature differential in the radial direction that prior art processes and also because the target substrate is rotated during deposition. In addition the present novel process is a one-step deposition process that makes polycrystalline silicon ingots, and it does not require a vacuum casting step. It simplifies the manufacturing process, and will lower the capital investment and operating cost of producing a polycrystalline silicon.

DETAILED DESCRIPTION OF THE DRAWINGS

Figure 1:
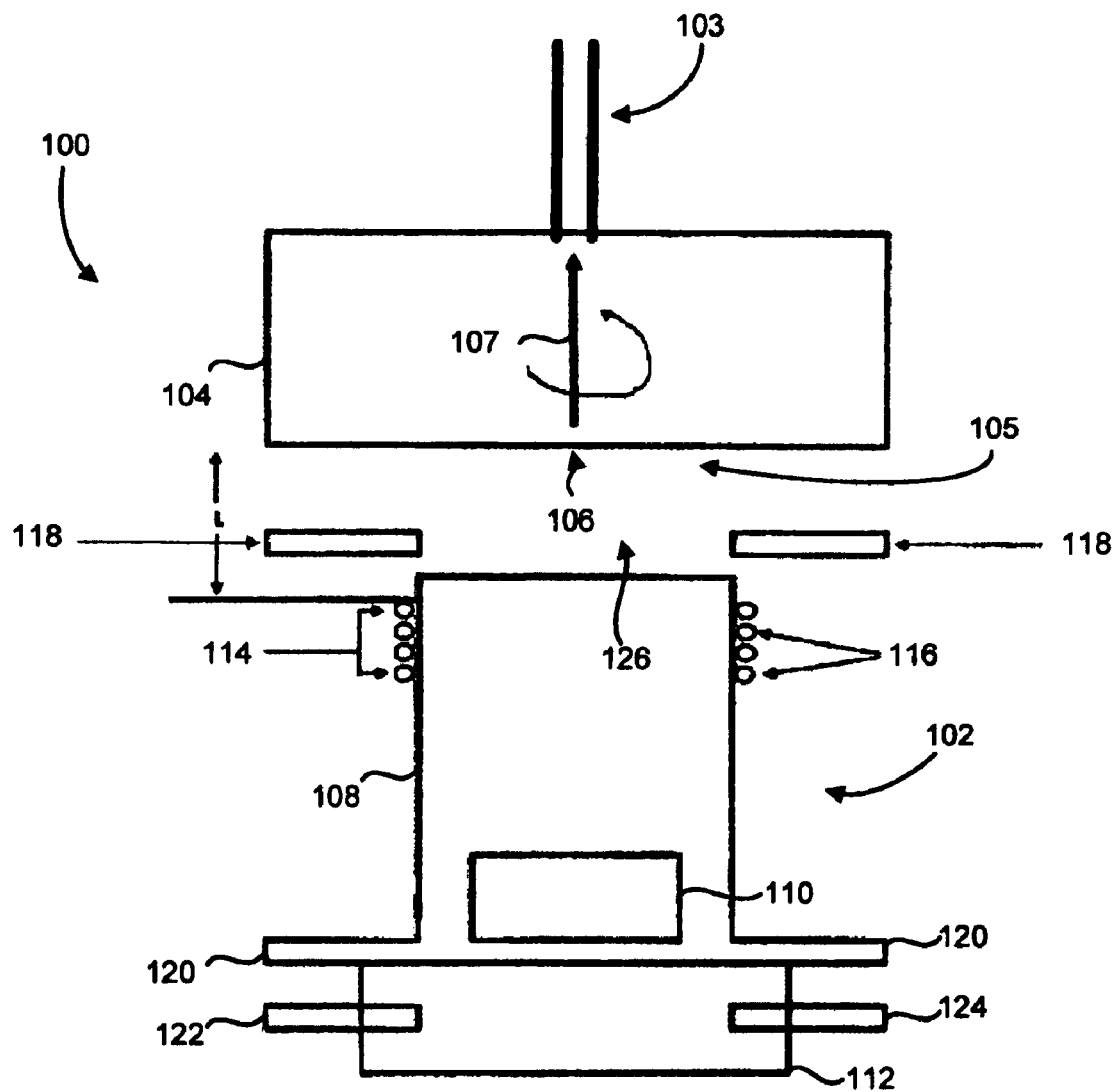
FIG. 1 illustrates a cutaway side view of the plasma deposition apparatus for making polycrystalline silicon according to an embodiment of the present invention.

FIG. 1 illustrates an embodiment 100 of plasma deposition apparatus including an induction coupled plasma torch 102 positioned below a supported target substrate 104 held by support 103. The target substrate 104 may be any desired size including those sizes commonly known in the art of solar cells. In this embodiment, the induction coupled plasma torch 102 is aimed upward for depositing a reaction product on the deposition surface 106 of the target substrate 104. In another embodiment, the induction coupled plasma torch 102 may be aimed or oriented in another manner or direction with respect to the target substrate 104. The induction coupled plasma torch 102 consists of two concentric quartz tubes: an outer quartz tube 108 and a shorter inner quartz tube 110, which are shown to be attached to a stainless steel chamber 112.

Typically, the diameter and height or length of the outer quartz tube 108 and the inner quartz tube 110 may be any size to fit the desired application of the outer quartz tube 108 and inner quartz tube 110. Preferably, the inner quartz tube 108 has a shorter length than the outer quartz tube 108. Also, the outer quartz tube 108 preferably has a diameter in the range of from about 50 millimeters ("mm") to about 90 mm and a height in the range of from 180 mm to about 400 mm. More preferably, the diameter for the outer quartz tube 108 is about 70 mm with a height or length of about 200 mm. Preferably, the inner quartz tube 110 has a diameter in the range of from about 50 mm to about 70 mm and a height in the range of from about 120 mm to about 180 mm. More preferably, the diameter of the inner quartz tube 110 is about 60 mm with a height of about 150

The target substrate 104 may be an ingot or other form of polycrystalline silicon substrate. In this embodiment, the deposition surface 106 is substantially perpendicular to the induction coupled plasma torch 102. Preferably, the support 103 rotates the target substrate 104 about its axis 107. In addition, support 103 further moves the target substrate 104 away from the induction coupled plasma torch 102 as the silicon layer is deposited on the deposition surface 106 to keep the distance "L" constant during the deposition process. Deposition of the silicon takes place on the deposition surface 106 of the substrate and this area of activity is noted generally as the deposition zone 105. The distance between the uppermost portion of the coil 114 and the target substrate 104, as designated by "L" is in the range of from about 10 mm to about 40 mm depending on the deposition temperature. Support 103 may be any type of mechanical support capable of supporting, rotating, and/or moving the target substrate 104 during a deposition process. Preferably, support 103 is resistant to high temperatures and has sufficient mechanical strength to support the deposition target 104 while moving the deposition target 104 up and down and rotating the deposition target 104. In one embodiment, the support is a rod-shaped rigid member that is connected to the deposition target 104. Further it may be coupled to motors for rotating the deposition target 104. In one embodiment, the support 103 is a quartz rod or high temperature corrosion resistant stainless steel rod.

In addition to the deposition zone 105, the plasma deposition apparatus 100 further includes a reaction zone 126 that is separated a distance from the deposition zone 105. This space that separates the reaction zone 126 from the deposition zone 105 is provided partially by the perpendicular orientation of the induction coupled plasma torch 102 to the deposition surface 106 of the deposition target 104 and also partially by the distance between the induction coupled plasma torch 102 and the deposition surface 106 of the deposition target 104. This separation provides for improved deposition efficiency by and through the larger area of the deposition surface 106 of the deposition target 104. This separation further allows for increased plasma temperatures in the reaction zone 126, while maintaining lower temperatures at the deposition zone 105. This higher plasma temperature in the reaction zone provides for improved conversion efficiency of the endothermic chemical reactions in the reaction zone 126. In addition, the lower temperature in the deposition zone 105 ensures that the desired characteristics and quality of the silicon is deposited on the deposition surface 106 of the target substrate 104.

The induction coupled plasma torch 102 further includes a copper induction coil 114 that is located around the upper portion of the outer quartz tube 108. The coil 114 comprises a plurality of windings 116 having a diameter of approximately in the range of from about 56 mm to about 96 mm. Preferably, the plurality of windings 116 has a diameter of about 82 mm. Typically, the plurality of windings 116 are spaced apart from each other by a sufficient distance to provide for operation of the induction coupled plasma torch 102. Preferably, the plurality of windings 116 are spaced apart from each other by about 6 mm. In addition, a gap between the outer quartz tube 108 and the coil 114 can be in a range of from about 2 mm to about 10 mm.

The induction coupled plasma torch 102 further includes a pair of injection ports 118 that are connected to a precursor source chemical line (not shown) carrying the precursor source chemicals to the induction coupled plasma torch 102. With the use of the inner quartz tube 110, the plasma source gas will have a swirl flow pattern. The source chemicals for deposition of semiconductor thin film material such as silicon will be injected through the injection ports 118, which are preferably located near the lower side of the induction coupled plasma torch 102 and aimed toward the V=0 position for the same reason as disclosed in U.S. Pat. No. 6,253,580 issued to Gouskov et al. and U.S. Pat. No. 6,536,240 issued to Gouskov et al, both of which are incorporated herein by reference. In one embodiment, the injection ports 118 are connected to the induction coupled plasma torch 102. In another embodiment, the injection ports 118 are not connected to the induction coupled plasma torch 102, but are connected to another structural element of the present invention as herein described. In one embodiment, the induction coupled plasma torch 102 is an inductively coupled plasma torch. The injection ports 118 comprise quartz tubing preferably having a diameter in the range of from about 3 mm to about 10 mm, more preferably of about 5 mm, although tubing diameters in other sizes may be used with the induction coupled plasma torch 102. In this embodiment, a pair of injection ports 118 are positioned diametrically across from each other. In another embodiment of the present invention, three or more ports, symmetrically arranged, may be utilized.

Further, induction coupled plasma torch 102 includes a pair of plasma gas inlets 120 that are connected to a plasma gas supply line (not shown) carrying plasma gases to the induction coupled plasma torch 102. The plasma gas inlets 120 enter the induction coupled plasma torch 102 at substantially the same height. Preferably, these plasma gas inlets 120 comprise stainless steel tubing having a diameter of 5 mm, although a range of diameters may suffice for this purpose.

The induction coupled plasma torch 102 is also provided with a coolant inlet 122 and coolant outlet 124. During use, a coolant, such as water, passes through the coolant inlet 122, circulates within the stainless steel chamber 112, and exits through the coolant outlet 124. The coolant inlet 122 and coolant outlet 124 are preferably formed from stainless steel and have a diameter of 5 mm, for example.

The plasma gas inlets 120, the coolant inlet 122 and the coolant outlet 124 are all preferably formed in a stainless steel chamber 112. The chamber 112 is preferably a stainless steel square block 80 mm on a side, and having a height of approximately 40 mm, for example. Preferably, the chamber 112 is mounted onto the support stand (not shown).

A high frequency generator (not shown) is electrically connected to the coil 114, powering it with a variable power output up to 60 kW at a frequency of 5.28+/−0.13 MHz. In an embodiment, the generator is Model No. IG 60/5000, available from Fritz Huettinger Electronic GmbH of Germany. Preferably, this generator is driven with a 50 Hz, 3-phase, 380 V power supply to energize the induction coupled plasma torch 102.

Figure 2:
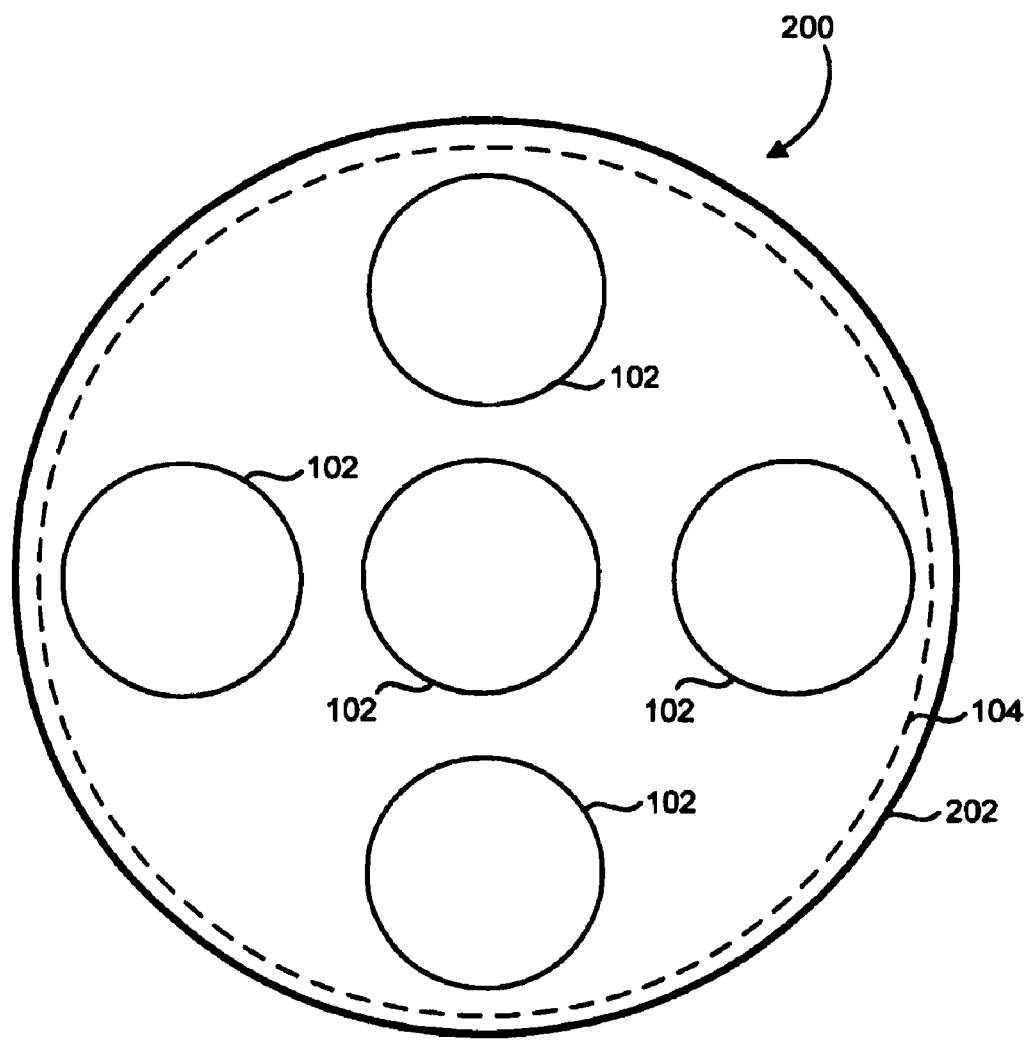
FIG. 2 illustrates a top view of a plasma deposition apparatus including several plasma deposition torches relative to a substrate housed in a chamber according to another embodiment of the present invention.

FIG. 2 shows another embodiment 200 of a deposition apparatus that consists of a set of induction coupled plasma torches 102 located within a deposition chamber 202. By using a plurality of induction coupled plasma torches 102, located within the deposition chamber 202, all oriented substantially perpendicular to the deposition surface 106 of the target substrate 104, the deposition apparatus 200 covers a wider deposition width or area. As described above, the target substrate 104 is moved upward away from the induction coupled plasma torch 102 and is also rotated about its axis 107 by the support 103. The target substrate 104 is shown extending almost to the perimeter of the deposition chamber 202. In addition to a high deposition rate, the deposition apparatus 200 provides uniform deposition thickness. In this embodiment, the deposition apparatus 200 consists of five induction coupled plasma torches 102 each having a diameter of preferably 70 mm. Four of the five induction coupled plasma torches 102 are spaced equally apart from each other around the perimeter of the deposition chamber 202. In this embodiment, the four induction coupled plasma torches 102 located around the perimeter of the deposition chamber 202 are separated by 90° from each other. In this embodiment, the fifth induction coupled plasma torch 102 is located in the center of the deposition chamber 202.

Other arrangements and sizes of induction coupled plasma torches 102 may be used in a deposition chamber to provide for a desired deposition width or area for a particular application. In this embodiment, the use of five induction coupled plasma torches 102 will produce a deposition area of approximately 300 mm. Preferably, the target substrate 104 will rotate around its axis 107 while also being moved upwards or away from the induction coupled plasma torch 102 to maintain a fixed or constant distance between the target substrate 104 and the induction coupled plasma torches 102.

Figure 3:
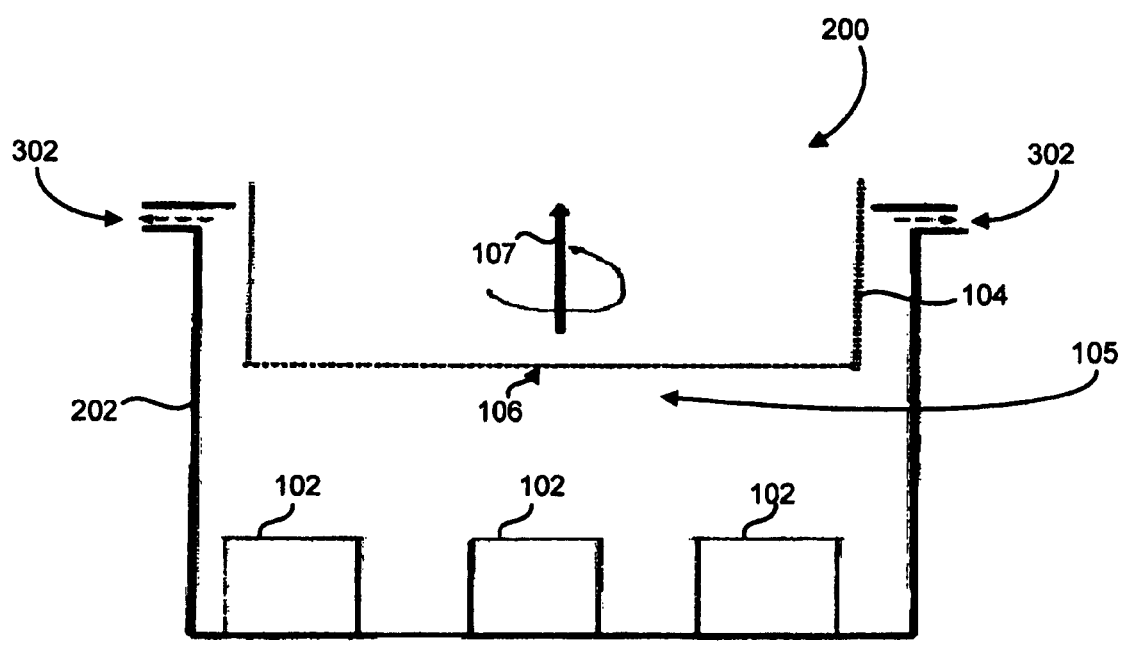
FIG. 3 illustrates a side view of the plasma deposition apparatus including several plasma deposition torches relative to a substrate housed in a deposition chamber of FIG. 2 according to another embodiment of the present invention.

Referring to FIG. 3, a side view of the deposition apparatus 200 is shown. The deposition chamber 202 includes exhaust ports 302 that are located at the top end of the deposition chamber 202. Preferably, the exhaust ports 302 are located above the lower end or deposition surface 106 of the deposition target 104. An exhaust system (not shown) will remove all gases and any un-deposited silicon particles from the chemical reactions. Preferably, the exhaust system controls or maintains a fixed partial pressure inside the deposition chamber 202 to ensure an optimum deposition condition. The control of the partial pressure within the deposition chamber 202 may further include providing a negative pressure, such as a vacuum. In another embodiment, the partial pressure may be controlled at or near atmospheric pressure. Any number of exhaust ports 302 may be employed as desired for a specific application. Preferably, the deposition chamber 202 is made of an explosive proof material and RF shield material for preventing escape of RF energy from the deposition chamber 202 and for isolating the environmental influences upon the deposition chamber 202.

By using a plurality of induction coupled plasma torches 102, located within the deposition chamber 202, all oriented substantially perpendicular to the deposition surface 106 of the target substrate 104, the deposition apparatus 200 covers a wider deposition width or area. The target substrate 104 is shown extending almost to the perimeter of the deposition chamber 202. In addition to a high deposition rate, the deposition apparatus 200 provides uniform deposition thickness. In this embodiment, the deposition apparatus 200 consists of five induction coupled plasma torches 102 each having a diameter of preferably 70 mm. Four of the five induction coupled plasma torches 102 are spaced equally apart from each other around the perimeter of the deposition chamber 202. In this embodiment, the fifth induction plasma torch is located in the center of the deposition chamber 202.

Figure 4:
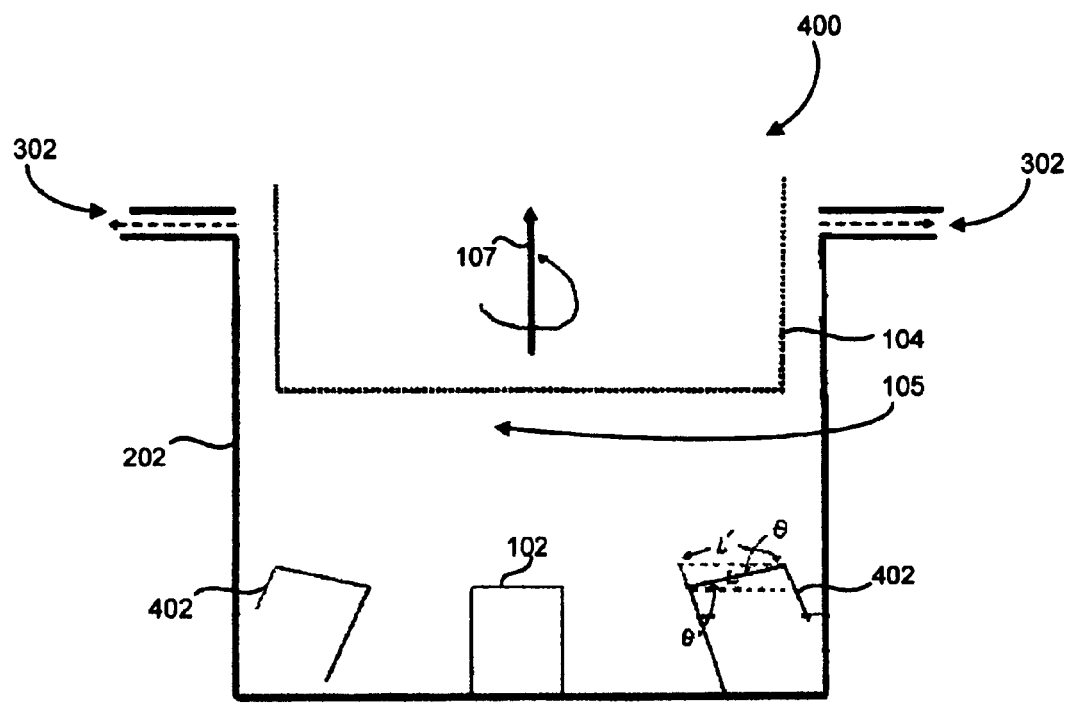
FIG. 4 illustrates a side view of a plasma deposition apparatus including tilted induction coupled plasma torches relative to a substrate housed in a deposition chamber according to another embodiment of the present invention.

FIG. 4 shows another embodiment 400 of a deposition apparatus that consists of an induction coupled plasma torch 102 in between two induction coupled plasma torches 402 that are slightly tilted, the induction coupled plasma torches 102 and 402 are located within a deposition chamber 202. Induction coupled plasma torches 402 are constructed and function similarly to induction coupled plasma torch 102, but they are slightly titled from a horizontal plane by θ degrees within the deposition chamber 202. The degrees of tilt of the induction coupled plasma torches 402 is preferably from about 15 degrees to about 45 degrees. Preferably, the induction coupled plasma torches 402 are tilted approximately 15 degrees from the horizontal plane. The tilted induction coupled plasma torches 402 provide improved deposition of polycrystalline silicon on the deposition surface 106 of the target substrate 104 with good uniformity. It is noted that if the angle of tilt for the induction coupled plasma torch 402 is too great, then the deposition rate or collection efficiency decreases and the deposition becomes less uniform. Further, the degree of tilt for each induction coupled plasma torch 402 may be different.

From FIG. 4, it is observed that the diameter "L'" of the induction coupled plasma torch 402 can be deduced from the formula: $L'=L/Cos\ \theta > L$. Thus, the deposited diameter L' from the induction coupled plasma torch 402 is larger than the diameter of the induction coupled plasma torch 102.

As described above, the plasma source gas will have a swirl flow pattern. This is caused by the plasma source gas being injected through the plasma gas inlets 120 that feeds the plasma source gas between the outer quartz tube 108 and the inner quartz tube 110. The induction coupled plasma torches 102 and 402 preferably uses the inert plasma source gas to form the plasma where the reaction takes place between the precursor gas source and the induction coupled plasma torches 102 and 402 for depositing the reaction product on the target substrate 104. The plasma source gas will be an inert gas that preferably has a (i) low activation energy, and (ii) is chemically inert such that no oxides or nitrides will be formed. Preferably, the plasma source gas may be selected from the group including helium argon, hydrogen, or a mixture of them.

The reaction product is produced by the reaction of the precursor gas sources in the presence of the induction coupled plasma torches 102 and 402. The precursor gas source may include or be additional forms of matter such as gases, vapors, aerosols, small particles, nanoparticles, or powders. In addition, a p-type or n-type dopant material may also be injected with the precursor gas source simultaneously to form the desired p-type or n-type semiconductor. Some examples of dopant materials include boron, phosphorous, and the like.

In addition to the aforementioned aspects and embodiments of the present plasma deposition apparatuses 100, 200, and 400, the present invention further includes methods for manufacturing these polycrystalline silicon substitutes or ingots. One preferred method includes a chloride based system that utilizes the plasma flame or energy to reduce trichlorosilane ($SiHCl_3$) by hydrogen ($H_2$) to form silicon. It can also reduce silicon tetrachloride ($SiCl_4$) with hydrogen by the plasma flame energy to make silicon.

Figure 5:
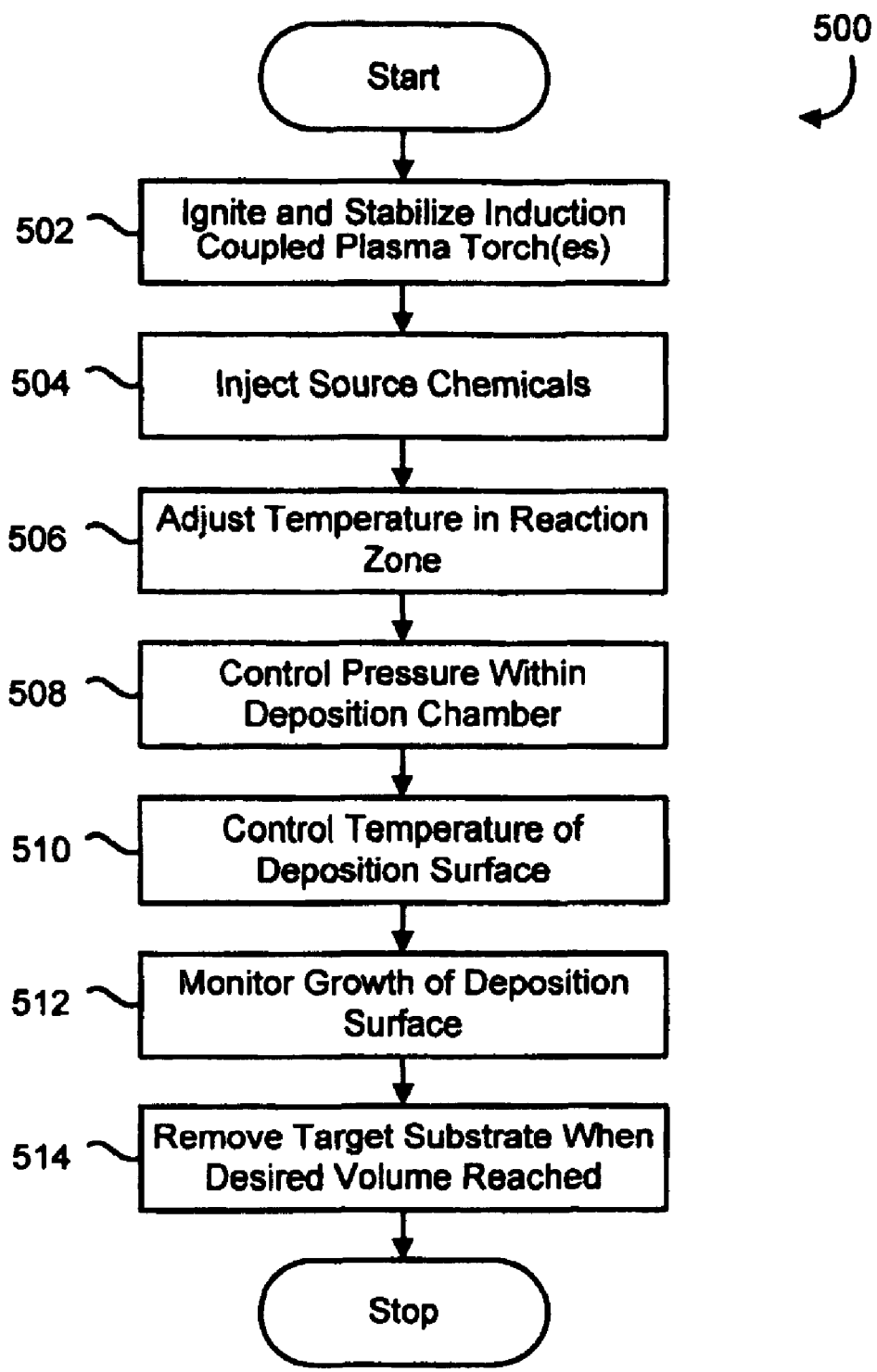
FIG. 5 illustrates a flow diagram of a process for making polycrystalline silicon according to an embodiment of the present invention.

FIG. 5 illustrates a flow diagram of an embodiment 500 of one such process. In step 502, the induction coupled plasma torch or torches 102 and 402 are initiated. This step can include initiating the flow of the plasma gas supply to the plasma gas inlets 120 and then plasma ignition by supplying electricity to the induction coil 114. This step includes igniting and stabilizing the plasma flame of the induction coupled plasma torch or torches 102 and 402. In addition, step 502 may also include selecting the precursor gas source to be used to produce the desired reaction product during deposition on the target substrate 104.

In step 504, the deposition apparatuses 100, 200, and 400 inject the precursor gas source through the injection ports 118 to the plasma flame of the induction plasma torch or torches 102 and 402. As discussed above, preferably the precursor gas source is selected from $SiHCl_3$ plus $H_2$, or $SiCl_4$ plus $H_2$. In step 506, the plasma flame or the induction plasma torch or torches 102 is stabilized and the reaction temperature of the induction plasma torch or torches 102 and 402 in the reaction zone 126 is adjusted to optimize the formation of polycrystalline silicon.

As described above, the gases that are not deposited on the deposition surface 106 of the target substrate 104 are collected through the exhaust system and recycled for additional use. In one aspect of the present method for making polycrystalline silicon, the $SiHCl_3$ and $SiCl_4$ can be made from metallurgical grade silicon (MGS) or Silica. They will react with Hydrogen Chloride (HCl) that is collected and separated from the exhaust gas stream of the present process for making polycrystalline silicon. In addition, it is always possible to add fresh Chlorine ($Cl_2$) or HCl, if sufficient quantities do not exist from the exhaust stream. After purification by distillation, reaction products can be used as precursor source gas chemicals for making silicon.

In addition to HCl in the exhaust stream, there are Ar, $H_2$, dichlorosilane ($SiH_2Cl_2$), and un-reacted $SiHCl_3$ and $SiCl_4$ plus the un-deposited silicon particles may also exist. The un-deposited silicon particles can be separated out by using a bag filter. Further, using a cold trip, chlorosilanes can be easily separated and reused as precursor source gas chemicals. The gases such as Ar and $H_2$ can also be recycled from the exhaust system and can be used for plasma source gas or precursor source gas.

In step 508, the pressure within the deposition chamber 202 is controlled and maintained by the exhaust system. In addition, other means may be employed to maintain the pressure within the deposition chamber 202. In step 510, the temperature of the deposition surface 106 of the target substrate 104 is controlled and maintained to optimize the deposition of the silicon onto the deposition surface 106. In step 512, the growth of the deposition surface 106 of the target substrate 104 is monitored. As the deposition surface 106 grows, the support 103 moves the target substrate 104 away from the induction plasma torch or torches 102 and 402 to maintain a constant or fixed distance L between the induction plasma torch or torches 102 and 402 and the deposition surface 106 of the target substrate 104. In step 514, the support 103 removes the target substrate 104 from the deposition chamber 202 when the desired length or volume of silicon is deposited.

In addition to the above, the silicon particles will be separated out from the exhaust stream. These particles will be collected, loaded into a quartz crucible, melted and grow into single crystal ingots. All the gases whether un-reacted or by-products chemicals will also be collected and separated by typical industry processes. Some exemplary raw materials include hydrides, fluorides, chlorides, bromides, and argon gas.

In another embodiment of the present method for making polycrystalline silicon, a hydride based system is employed. Silane does not have high deposition rate as trichlorosilane, but it is still widely used in the industry, because it is much easier to purify and also to produce desired high quality silicon. Following the same processing steps above, Silane ($SiH_4$) or Disilane ($Si_2H_6$) in the gas form can be delivered to the injection ports 118 as stated in step 504 and in the presence of the plasma flame or energy they will dissociate into silicon and hydrogen. By using a higher reaction temperature and removal of hydrogen gas quickly improved chemical reaction conversion is achieved. In addition, the un-deposited silicon particles and plasma source gas, such as Argon, are collected through the exhaust ports 302 for re-processing and recycling.

In another embodiment of the present methods for making polycrystalline silicon, a bromine system is employed following the process steps described above. Both bromine ($Br_2$) is chemically less aggressive and also less corrosive than chlorine ($Cl_2$). When using Br as a laden gas, a significant equipment costs can be saved. The laden gas is used as a transporting agent to bring, convert, and make the dirtly silicon (metallurgical grade silicon, MGS) into pure and useable solar grade silicon (SoG). It will react with the MGS to form Silicon Bromide (main product) and other impurities bromide compounds. After purification, Silicon Bromide is used for making polycrystalline silicon by plasma process. During the process, it decomposes the Silicon Bromide into silicon and bromine. The silicon is deposited and bromine is also collected and reused again. Because the present induction coupled plasma torches 102 and 402 have more than enough energy to drive the reaction in the desirable direction, it will not be a concern for the reduction reaction of silicon tetrabromide ($SiBr_4$) by hydrogen. Preferably, the raw material for this system will be MGS. At temperatures higher than 360° C., the reaction rate between Silicon and hydrogen bromide (HBr) or $Br_2$ can be high and the reaction product will be mainly $SiBr_4$. Due to the differences in boiling temperatures, it is very easy to separate out the Boron contamination ($BBr_3$ from $SiBr_4$). In this embodiment, the precursor source gas chemicals will be Silicon tetrabromide and Hydrogen.

In yet another embodiment of the present methods for making polycrystalline silicon, a reduction of silica soot particles by carbon is employed. In optical preform production, the solid waste is the silica soot particles and they usually are sent to a landfill for disposal. These silica soot particles are very pure and can be a good source for making Solar Grade Silicon (SoG) by the carbothermic reduction reaction with carbon. Typically, it uses an electric arc furnace as a heat source and following the process steps described above, a powder form of $SiO_2$ and carbon are injected through the injection ports 118 into the plasma flames of the induction coupled plasma torches 102 and 402. These soot particles from preform manufacturers do not typically contain transition metal ions and also they do not typically contain boron. Nevertheless, the soot particles may have trace amount of phosphorous and some germanium. To eliminate the possible impurity contamination from the raw materials, small amount of $Cl_2$ and moisture can be injected with the precursor gas source. This embodiment converts the soot particle waste from optical fiber manufacturing plant into a useful product for producing polycrystalline silicon, and thus generating efficient and cost effective solar panels.

In another aspect of the present methods for making polycrystalline silicon, the target substrates 104 may be removed from the process at other times than described above to measure the thicknesses, compositions, and/or performance of the deposition process to determine whether to adjust any of the process parameters described above.

Although there has been described what is at present considered to be the preferred embodiments of the plasma deposition apparatus and methods for making polycrystalline silicon, it will be understood that the present plasma deposition apparatus can be embodied in other specific forms without departing from the spirit or essential characteristics thereof. For example, additional induction coupled plasma torches or different combinations of deposition modules, other than those described herein could be used without departing from the spirit or essential characteristics of the present plasma deposition apparatus and methods for making polycrystalline silicon. The present embodiments are, therefore, to be considered in all aspects as illustrative and not restrictive. The scope of the invention is indicated by the appended claims rather than the foregoing description.

What is claimed:

1. A plasma deposition apparatus for making polycrystalline silicon comprising:
   chamber means for depositing said polycrystalline silicon;
   means for supporting a target substrate having a deposition surface;
   induction coupled plasma torch means for producing a plasma flame for reacting at least one reactant to produce a reaction product and depositing said reaction product on said target substrate, said plasma torch means located a fixed distance from said substrate, wherein said means for supporting moves said target substrate in a direction away from said induction coupled plasma torch means to provide said fixed distance between said target substrate and said induction coupled plasma torch means; and at least one injection port disposed between said induction coupled plasma torch and said deposition surface, said at least one injection port connected to a precursor chemical source for injecting said precursor chemical source into said induction coupled plasma torch.

2. The plasma deposition apparatus for making polycrystalline silicon of claim 1 wherein said reaction product is selected from the group consisting of silicon, intrinsic silicon, p-type doped silicon, and n-type doped silicon.

3. The plasma deposition apparatus for making polycrystalline silicon of claim 1 wherein said at least one reactant is in the form of a material selected from the group consisting of a gas, vapor, aerosol, small particle, nanoparticles, or powder.

4. The plasma deposition apparatus for making polycrystalline silicon of claim 1 wherein said at least one reactant is hydrogen ($H_2$) and at least one compound selected from the group consisting of trichlorosilane ($SiHCl_3$), silicon tetrachloride ($SiCl_4$), dichlorosilane ($SiH_2Cl_2$), Silane ($SiH_4$), Disilane ($Si_2H_6$), Silicon tetrabromide ($SiBr_4$), and mixtures thereof.

5. The plasma deposition apparatus for making polycrystalline silicon of claim 1 wherein said plasma flame is produced from at least one gas selected from the group consisting of helium gas, argon gas, hydrogen gas, and mixtures thereof.

6. The plasma deposition apparatus for making polycrystalline silicon of claim 1 wherein said chamber means further includes:

an exhaust means located above said deposition surface for exhausting at least one of un-deposited solids and un-reacted chemicals from said chamber means.

7. The plasma deposition apparatus for making polycrystalline silicon of claim 6 wherein said chamber means further includes:

a recycling means for recycling said at least one of said un-deposited solids and unreacted chemicals exhausted from said chamber means for re-use in said deposition apparatus.

8. The plasma deposition apparatus for making polycrystalline silicon of claim 1 wherein said induction coupled plasma means further comprises:

an induction coil that comprises a plurality of windings having a diameter greater than that of said outer quartz tube and spaced apart from each other by distance of about 2-10 mm.

9. The plasma deposition apparatus for making polycrystalline silicon of claim 8 wherein said distance between said induction coil and said target substrate is between about 30-55 mm.

10. The plasma deposition apparatus for making polycrystalline silicon of claim 1 wherein said induction coupled plasma torch and said deposition surface are substantially perpendicular to each other.

11. The plasma deposition apparatus for making polycrystalline silicon of claim 10 wherein said induction coupled plasma torch is positioned substantially vertically.

12. The plasma deposition apparatus for making polycrystalline silicon of claim 1 wherein said deposition surface is rotated during deposition of said reaction product.

13. A plasma deposition apparatus for making polycrystalline silicon comprising:

a chamber for depositing said polycrystalline silicon, said chamber having an exhaust system for recovering at least one of un-deposited solids and un-reacted chemicals;

a support located within said deposition chamber for holding a target substrate having a deposition surface, said deposition surface defining a deposition zone;

at least one induction coupled plasma torch located within said deposition chamber and spaced apart from said support, said at least one induction coupled plasma torch producing a plasma flame that is substantially perpendicular to said deposition surface, said plasma flame defining a reaction zone for reacting at least two reactants to produce said polycrystalline silicon for depositing a layer of said polycrystalline silicon said deposition surface; and at least one injection port disposed between said at least one induction coupled plasma torch and said deposition surface, said at least one injection port connected to a precursor chemical source for injecting said precursor chemical source into said at least one induction coupled plasma torch.

14. The plasma deposition apparatus for making polycrystalline silicon of claim 13 wherein said polycrystalline silicon is selected from the group consisting of silicon, intrinsic silicon, p-type doped silicon, and n-type doped silicon.

15. The plasma deposition apparatus for making polycrystalline silicon of claim 13 wherein said at least two reactants are deposited in the form of a material selected from the group consisting of a gas, vapor, aerosol, small particle, nanoparticles, or powder.

16. The plasma deposition apparatus for making polycrystalline silicon of claim 13 wherein said at least two reactants are produced by hydrogen ($H_2$) and at least one gas selected from trichlorosilane ($SiHCl_3$), silicon tetrachloride ($SiCl_4$), dichlorosilane ($SiH_2Cl_2$), Silane ($SiH_4$), Disilane ($Si_2H_6$), Silicon tetrabromide ($SiBr_4$), and mixtures thereof.

17. The plasma deposition apparatus for making polycrystalline silicon of claim 13 wherein said plasma torch means is produced from at least one gas selected from the group consisting of helium gas, argon gas, hydrogen gas, and mixtures thereof.

18. The plasma deposition apparatus for making polycrystalline silicon of claim 13 wherein said chamber means further includes:

an exhaust system located above said deposition surface for exhausting said at least one of un-deposited solids and un-reacted chemicals from said chamber means.

19. The plasma deposition apparatus for making polycrystalline silicon of claim 13 wherein said chamber for depositing is made from a material that shields RF energy and isolates said chamber from the environment outside of said chamber.

20. The plasma deposition apparatus for making polycrystalline silicon of claim 19 wherein said exhaust system further comprises:

exhaust ports for removing by-product gases and particles from said chamber.

21. The plasma deposition apparatus for making polycrystalline silicon of claim 18 wherein said exhaust system controls the partial pressure in said chamber.

22. The plasma deposition apparatus for making polycrystalline silicon of claim 13 wherein said at least one induction coupled plasma torches comprises:

an outer quartz tube and an induction coil comprising a plurality of windings having a diameter greater than that of said outer quartz tube;

an inner quartz tube; and a chamber connecting said outer quartz tube and said inner quartz tube, wherein said plasma gas source is connected to said chamber to provide said plasma gas source between said outer quartz tube and said inner quartz tube.

23. The plasma deposition apparatus for making polycrystalline silicon of claim 22 wherein said outer quartz tube has a length of about 180-400 mm.

24. The plasma deposition apparatus for making polycrystalline silicon of claim 22 wherein said outer quartz tube has a diameter of about 50-90 mm.

25. The plasma deposition apparatus for making polycrystalline silicon of claim 22 wherein said inner quartz tube has a length of about 120-180 mm.

26. The plasma deposition apparatus for making polycrystalline silicon of claim 22 wherein said inner quartz tube has a diameter of about 50-70 mm.

27. The plasma deposition apparatus for making polycrystalline silicon of claim 22 wherein said windings are spaced apart from each other by distance of about 2-10 mm.

28. The plasma deposition apparatus for making polycrystalline silicon of claim 27 wherein said distance between said induction coil and said target substrate is between about 30-55 mm.

29. The plasma deposition apparatus for making polycrystalline silicon of claim 22 further comprising a high frequency generator connected to said induction coil.

30. The plasma deposition apparatus for making polycrystalline silicon of claim 13 further comprising:

recycling said recovered said un-deposited solids to be processed into an ingot.

* * * * *